US006031916A

United States Patent [19]

Saito et al.

[11] Patent Number: 6,031,916
[45] Date of Patent: Feb. 29, 2000

[54] SOUND EFFECT ADDING DEVICE USING DSP

[75] Inventors: Tsutomu Saito; Masayuki Suda; Mineo Kitamura, all of Hamamatsu, Japan

[73] Assignee: Kabushiki Kaisha Kawai Gakki Seisakusho, Shizuoka-ken, Japan

[21] Appl. No.: 08/806,920

[22] Filed: Feb. 26, 1997

[30] Foreign Application Priority Data

Feb. 28, 1996 [JP] Japan .................................... 8-065197
Mar. 11, 1996 [JP] Japan .................................... 8-080490
Mar. 18, 1996 [JP] Japan .................................... 8-087096

[51] Int. Cl.[7] .................................................. H03G 3/00
[52] U.S. Cl. .................................................. 381/61
[58] Field of Search .......................... 381/61, 63; 84/626, 84/630, DIG. 26

[56] References Cited

U.S. PATENT DOCUMENTS 5,073,942 12/1991 Yoshida et al. ........................... 381/63
5,539,896 7/1996 Lisle .
5,546,466 8/1996 Ishiguro et al. .
5,744,741 4/1998 Nakajima et al. .

*Primary Examiner*—Vivian Chang
*Attorney, Agent, or Firm*—Bachman & LaPointe, P.C.

[57] ABSTRACT

A sound effect adding device includes an instruction storage section in a DSP for storing a main routine including a program for controlling an input and an output of an audio signal, and a plurality of selected sound effect adding routines transferred from a master CPU from among selectable sound effect adding routines when necessary and operable when accessed by the main routine. The main routine has a function to assign the input audio signal to the selected sound effect adding routines and collect sound effect added signals outputted from the selected sound effect adding routines so as to provide an output signal. By changing coefficient data transferred from the master CPU and stored in the DSP, the main routine performs change in connection between the input and output signals so as to change a combination of the sound effects without altering the main routine. When changing one of the selected sound effect adding routines, the master CPU transfers only a newly selected sound effect adding routine to the instruction storage section.

5 Claims, 7 Drawing Sheets

SOUND EFFECT ADDING DEVICE USING DSP

BACKGROUND OF THE INVENTION

1. Field of the Invention

The present invention relates to a sound effect adding device which is capable of adding a plurality of sound effects to an input audio signal using a DSP (digital signal processor).

2. Description of the Prior Art

There have been available sound effect adding devices, for example, as disclosed in Japanese First (unexamined) Patent Publication No. 58-50595, wherein a plurality of sound effects are added in a time-division manner using one DSP.

In the foregoing conventional structure, a program corresponding to a sound effect to be added is transferred, per sound effect, to a DSP from a main arithmetic circuit, such as a CPU. Further, since the program is transferred in serial through handshake, the transfer rate is low resulting in a prolonged transfer time. Owing to association with other controls in the device, if the transfer rate is so low, the number of addable sound effects is limited, thereby leading to a poor musical expression.

Further, in the foregoing conventional structure, every time a change in sound effect occurs, a preprocessing, such as a corresponding clearing operation, is performed in a data storage section of the DSP and a corresponding program is transferred to the DSP from the CPU so that the program Is entirely switched to another. This may lead to no outputs of audio signal, an output of queer audio signal or an unstable temporary operation of the DSP during transfer of the program. For avoiding this, Japanese First (unexamined) Patent Publication No. 1-198796 discloses a structure, wherein a circuit bypassing a DSP and a cross-fade circuit are provided so as to cross-fade outputs from the bypassing circuit and the DSP, thereby stabilizing the operation of the DSP even if subjected to a change In sound effect. However, in this conventional structure, an additional discrete part, that is, the cross-fade circuit, is required so that reduction in size of the device and in number of the production steps can not be achieved.

SUMMARY OF THE INVENTION

Therefore, it is an object of the present invention to provide an improved sound effect adding device.

According to one aspect of the present invention, a sound effect adding device controlled by a main arithmetic circuit and capable of simultaneously selecting and processing a plurality of sound effects using a DSP, comprises an instruction storage section in the DSP for storing a main routine including a program for controlling an input and an output of an audio signal, and a plurality of selected sound effect adding routines transferred from the main arithmetic circuit from among selectable sound effect adding routines when necessary and operable when accessed by the main routine, wherein the main routine has a function to assign the input audio signal to the selected sound effect adding routines and collect sound effect added signals outputted from the selected sound effect adding routines so as to provide an output signal, and wherein, by changing coefficient data transferred from the main arithmetic circuit and stored in the DSP, the main routine performs change in connection between the input and output signals so as to change a combination of the sound effects without altering the main routine.

It may be arranged that, when changing the coefficient data to perform the connection change, envelope values derived in the DSP are used as the coefficient data, and that the coefficient data are gradually changed to target values so as to perform a cross-fade.

It may be arranged that the selected sound effect adding routines are stored in a given area of the instruction storage section regardless of sound effects to be added, and that all of the selectable sound effect adding routines can be stored in the given area.

According to another aspect of the present invention, a sound effect adding device controlled by a main arithmetic circuit and capable of simultaneously selecting and processing a plurality of sound effects using a DSP, comprises an instruction storage section in the DSP for storing a main routine including a program for controlling an input and an output of an audio signal, and a plurality of selected sound effect adding routines transferred from the main arithmetic circuit from among selectable sound effect adding routines when necessary and operable when accessed by the main routine, wherein, when changing one of the selected sound effect adding routines, the main arithmetic circuit transfers only a newly selected sound effect adding routine to the instruction storage section.

It may be arranged that the selected sound effect adding routines are stored in a given area of the instruction storage section regardless of sound effects to be added, and that all of the selectable sound effect adding routines can be stored in the given area.

According to another aspect of the present Invention, a sound effect adding device controlled by a main arithmetic circuit and capable of selecting and processing a plurality of sound effects using a DSP, comprising an instruction storage section in the DSP for storing a main routine including a program for controlling an input and an output of an audio signal, and a selected sound effect adding routine transferred from the main arithmetic circuit from among selectable sound effect adding routines when necessary and operable when accessed by the main routine, wherein, when changing the selected sound effect adding routine, the selected sound effect adding routine is bypassed, while an output timing of the audio signal is delayed by a given time.

It may be arranged that the main routine accesses the selected sound effect adding routine between a first input/output processing of the audio signal and a second input/output processing of the audio signal, and that the output timing of the audio signal is delayed so that a time between the first and second input/output processings becomes no less than a half of one sampling time of the DSP.

BRIEF DESCRIPTION OF THE DRAWINGS

The present invention will be understood more fully from the detailed description given hereinbelow, taken in conjunction with the accompanying drawings.

In the drawings.

DESCRIPTION OF THE PREFERRED EMBODIMENT

Now, a preferred embodiment of the present invention will be described hereinbelow with reference to the accompanying drawings.

Figure 1:
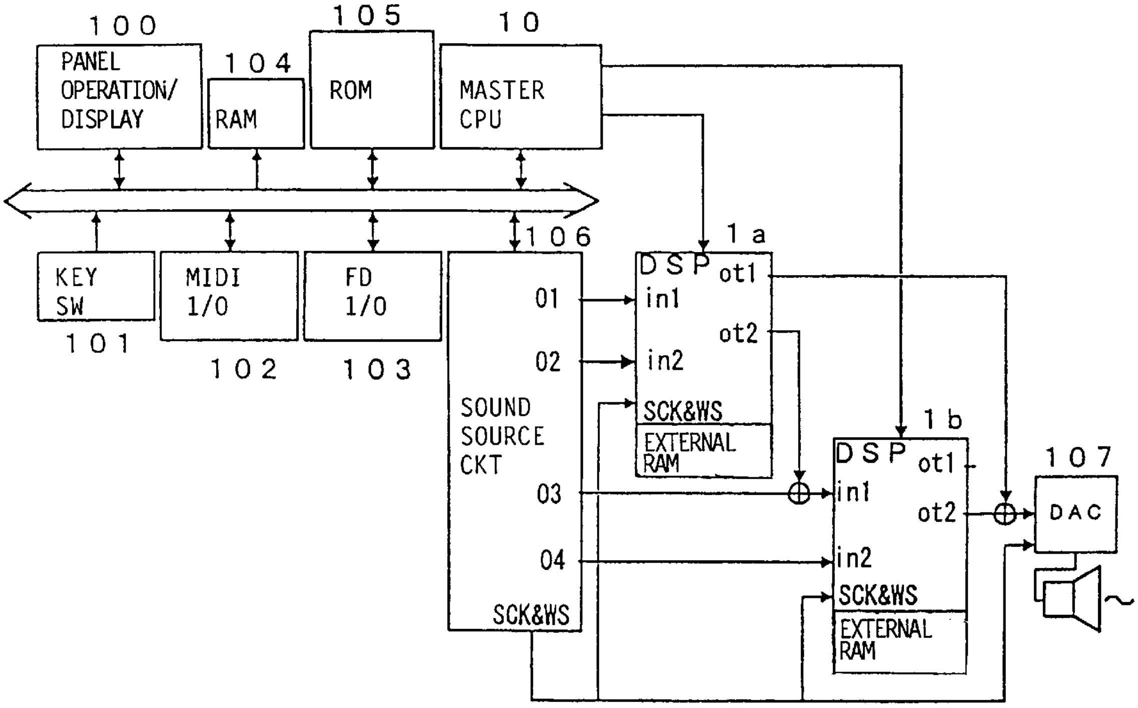
FIG. 1 is a block diagram showing an electronic musical instrument incorporating a sound effect adding device according to a preferred embodiment of the present invention.

FIG. 1 is a block diagram of an electronic musical instrument Incorporating a sound effect adding device according to a preferred embodiment of the present invention.

In the figure, numeral 100 denotes a panel operation/display block for inputting operation contents entered by a user (player) through a panel of the electronic musical instrument and for displaying a state of the electronic musical instrument, for example, a state of sound effect connection as shown in FIG. 3, according to a command from a master CPU 10.

Numeral 101 denotes a key switch block for inputting on-off information of a key switch and corresponding key velocity data into the master CPU 10.

A MIDI (musical Instrument digital interface) input/output block 102 outputs contents (information about key on-off, tone number change, sound effect change or the like) processed by the master CPU 10 through a MIDI, while feeding Information inputted through the MIDI to the master CPU 10.

An FD input/output block 103 stores information (performance information, panel resist information, sound effect information or the like) possessed by the master CPU 10 into an external storage medium, such as a flexible disk, and reads it out therefrom.

A RAM 104 is a working RAM for the master CPU 10 and further provides storage areas for automatic performance patterns and automatic accompaniment patterns.

A ROM 5 stores programs to be executed by the master CPU 10 and further stores later-described programs to be executed by DSP's 1*a* and 1*b*. As appreciated, the programs for the DSP's 1*a* and 1*b* may be stored in an external storage medium and read out into the RAM 104. Further, coefficient data to be used associated with various sound effect adding programs to be executed by the DSP's 1*a* and 1*b* are also stored in the ROM 105. The ROM 105 may be in the form of a flash memory.

In this preferred embodiment, the master CPU 10 works as a main arithmetic circuit for controlling the whole operation of the electronic musical instrument. The master CPU 10 performs, just after the power is on, initialization of the panel and the RAM 104 and further performs Initial program loader of the DSP's 1*a* and 1*b*. Further, when the tone is changed through the panel, the master CPU 10 sends a corresponding parameter to a sound source circuit 106 and, when there occurs the key on/off, the master CPU 10 updates a state of a corresponding channel of the sound source circuit 106 based on an assigned result thereof. Further, when a new sound effect to be added is selected through the panel or a new sound effect connection is selected through the panel among those as shown in FIG. 3, the master CPU 10 reads out the corresponding sound effect adding program and coefficient data or only the corresponding coefficient data and sends them to the DSP 1*a* and/or DSP 1*b*. As will be described later, only the corresponding coefficient data are sent to the DSP 1*a* and/or DSP 1*b* in case of a change in sound effect connection.

Figure 2:
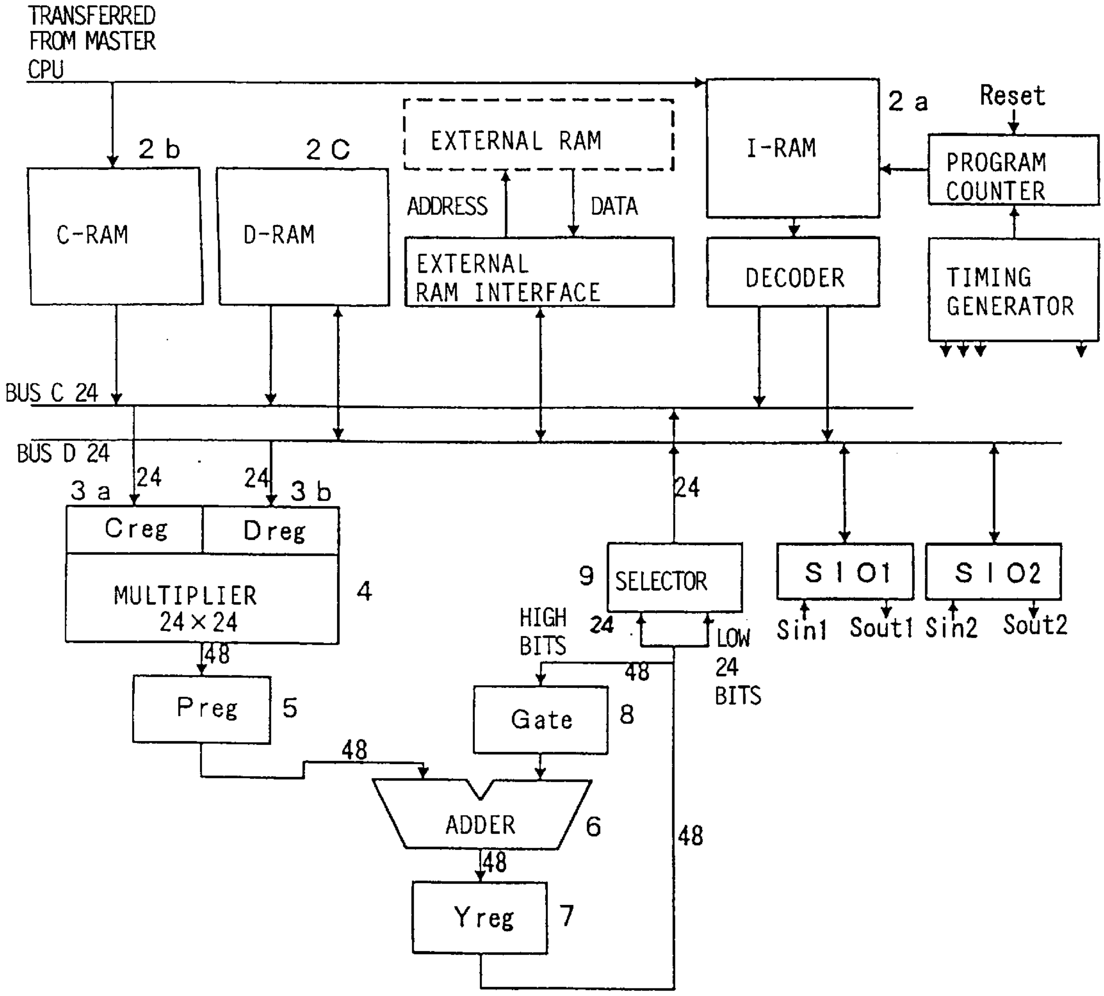
FIG. 2 is a block diagram showing a structure of one of DSP's incorporated in the sound effect adding device shown in FIG. 1.
Figure 3A:
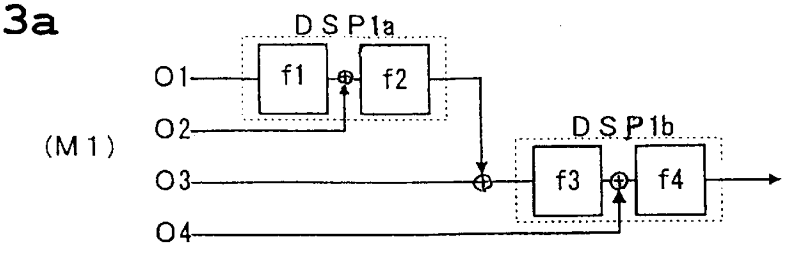
FIG. 3 is a diagram for explaining sound effect connections achieved by the DSP's in the sound effect adding device shown in FIG. 1.
Figure 3B:
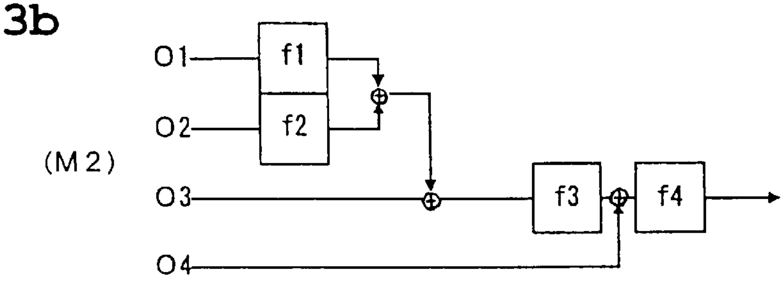
Figure 3C:
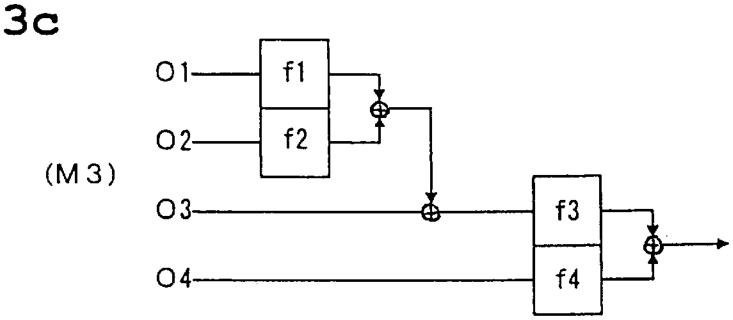
Figure 3D:
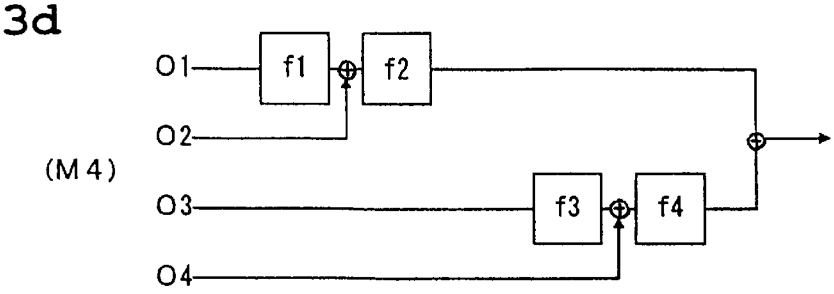
Figure 3E:
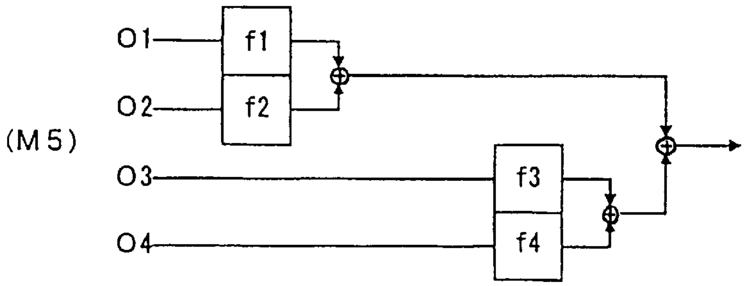

The sound source circuit 106 is under the control of the master CPU 10 so as to be capable of simultaneous tone generation of 32 DCO's (digital controlled oscillators), using a PCM waveform reading method, a sign combining method or the like. The 32 tones thus produced are multiplied at independent mixing rates relative to four output lines, respectively, and then added per output line for outputs from output terminals O1 to O4 of the sound source circuit 106. Each of the outputs from the output terminals O1 to O4 is in the form of a serial stereo signal and follows a CDF format generally used in CD's (compact disks), which is the same as an input format of a DAC (digital-analog converter) 107. Thus, these signals, if only subjected to mixing, can be directly fed to the DAC 107 bypassing the DSP's 1*a* and 1*b*. The DSP's 1*a* and 1*b* are the general-purpose DSP's which are the same with each other. Each of the DSP's 1*a* and 1*b* controls an external RAM (for example, 1Mbit DRAM) so as to add various sound effects to input audio signals. Each DSP has two inputs and two outputs which are in the form of stereo signals, respectively. Among output terminals of the DSP's, only the output terminal Sout1 of the DSP 1*b* is not connected to an external circuit. FIG. 2 shows a structure of one of the DSP's 1*a* and 1*b*. In the figure, based on programs transferred from the master CPU 10 and stored in an I-RAM (instruction RAM) 2*a* corresponding to an internal instruction storage section and coefficient data transferred from the master CPU 10 and stored in a C-RAM (coefficient RAM) 2*b*, a plurality of sound effect adding routines are executed in a time-division manner during one sample time (about 44.1 KHz) relative to an audio signal stored in a D-RAM (data RAM) 2*c*. Specifically, the programs stored in the I-RAM 2*a* are decoded in a decoder for performing controls within the DSP, the audio signal data inputted from the sound source circuit 106 are stored in the D-RAM 2*c*, and the coefficient data transferred from the master CPU 10 are stored in the C-RAM 2*b*. Then, the coefficient data and the audio signal data are stored in a Creg (coefficient register) 3*a* and a Dreg (data register) 3*b*, respectively. Subsequently, the product of the coefficient data and the audio signal data is derived at a multiplier 4 and temporarily stored in a Preg (P register) 5. The stored product is added at an adder 6 to the last sum temporarily stored in a Yreg (Y register) 7 and returned via a gate 8, and then the derived sum is stored in the Yreg 7, which is repeated the given number of times. Via a selector 9, 24 high bits of the resultant signal are stored in the D-RAM 2*c* (for double precision, 24 low bits of the resultant signal are also stored), and then another sound effect adding process is applied to the stored 24-bit signal or another sound effect adding process is applied to another audio signal. The processed signal (sound effect added signal) is then outputted from the output terminal Sout1 of an SIO1 or Sout2 of an SIO2. The audio signals are inputted into the DSP's 1*a* and 1*b* through the input terminals Sin1 and Sin2 of the SIO1 and SIO2, while the sound effect added signals are outputted from the output terminals Sout1 or Sout2 of the DSP's 1*a* and 1*b*. As described before, the output terminal Sout1 of the DSP 1*b* is not connected to the external circuit.

In the figure, symbols ⊕ provided at the output sides of the DSP's 1*a* and 1*b* represent adders, respectively. In practice, since Rch/Lch (right channel/left channel) time-division serial signals are fed in the CDF format, the signals are once subjected to serial-parallel conversion before the adder, then added, and further subjected to parallel-serial conversion so as to be outputted in the form of a serial signal.

The DAC 107 is a general-purpose digital-analog converter whose output signal is outputted from a speaker via an amplifier.

In this preferred embodiment, when a change in sound effect to be added to the input audio signal occurs, a new sound effect adding routine fn and coefficient data are transferred from the master CPU 10 to the I-RAM 2*a* and the C-RAM 2*b*, respectively, without changing a main routine, so as to reduce the whole data transfer amount. This change in sound effect causes corresponding prior clearing operations in the I-RAM 2*a* and the C-RAM 2*b*. While the new sound effect adding routine fn is transferred, processes of the routine fn are bypassed as will be described later In detail. On the other hand, when no change in sound effect to be added is required, but a change in combination of a plurality of sound effects to be added is required, only the corresponding coefficient data are transferred from the master CPU 10 so as to change a sound effect connection based on coefficient data change in the DSP 1*a* and/or the DSP 1*b*. This further reduces the data transfer amount.

FIG. 3 shows routes of the outputs of the sound source circuit 106 from the corresponding output terminals O1 to O4 to reach the DAC 107 via the DSP's 1*a* and 1*b*. In the figure, f1 and f2 represent two sound effect adding routines to be executed in the DSP 1*a*, while f3 and f4 represent two sound effect adding routines to be executed in the DSP 1*b*. As seen from the figure, there are available five sound effect connection patterns M1 to M5.

Figure 4:
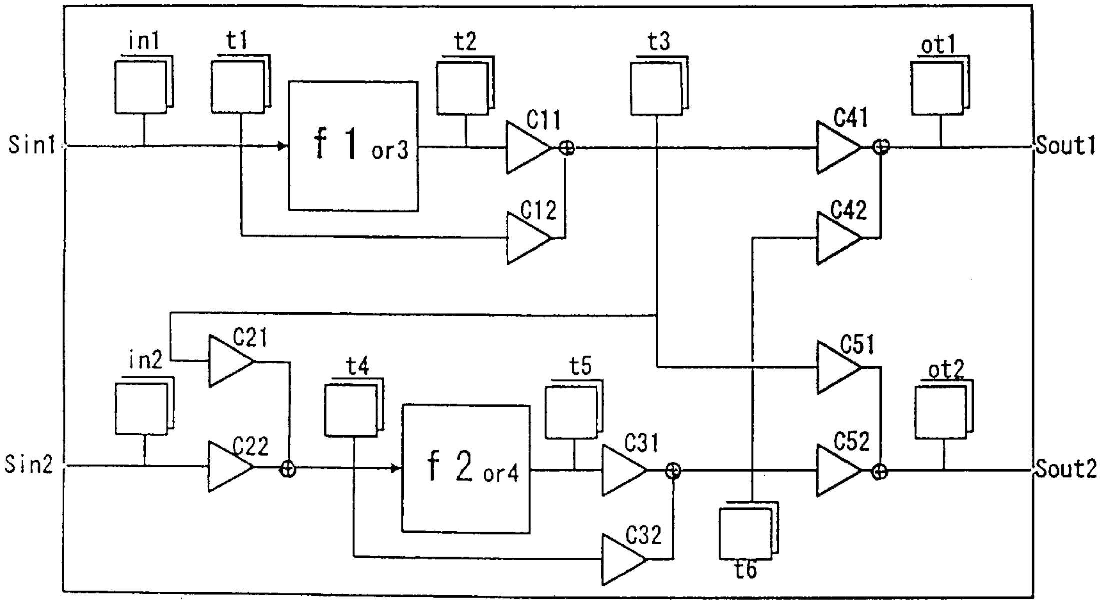
FIG. 4 is a diagram for explaining signal flows achieved by a main routine to be executed at each of the DSP's in the sound effect adding device shown in FIG. 1.

In the connection pattern M1, an audio signal outputted from the output terminal O1 of the sound source circuit 106 is applied with a tremolo effect through f1, then added with an audio signal outputted from the output terminal O2, and further applied with a chorus effect through f2. The resultant signal is added with an audio signal outputted from the output terminal O3, then applied with a delay effect through f3, then added with an audio signal outputted from the output terminal O4, and further applied with a reverb effect through f4 for an output to the DAC 107. As shown in FIG. 4, the change in sound effect connection is achieved by changing the coefficient data (for example, 0H←→7FFFH) in the main routine to be executed in each DSP. Further, whether to connect the DSP's 1*a* and 1*b* in serial or parallel is determined by whether to output the signal from the output terminal Sout1 or Sout2 of the DSP 1*a*, and thus determined by the coefficient data change in the DSP 1*a*. The coefficient data is in the form of 16-bit binary digits and is dealt with as a complement of 2 so that values of the coefficient data become as shown in Table 1. As shown in Table 1, the maximum value thereof is 7FFFH. Performing multiplication using this value means that multiplication by 32767/32768=0.99996948 is performed in the DSP. Since this value is approximately 1, 7FFFH represents "passing through" in this preferred embodiment, wherein no change is applied to the input signal.

TABLE 1

| coefficient | value to be processed |
|---|---|
| 7FFFH | +32767 |
| 7FFEH | +32766 |
| . . . | . . . |
| . . . | . . . |
| 0001H | +1 |
| 0000H | ±0 |
| FFFFH | −1 |
| FFFEH | −2 |
| . . . | . . . |
| . . . | . . . |
| 8001H | −32767 |
| 8000H | −32768 |

In the connection pattern M2, an audio signal outputted from the output terminal O1 of the sound source circuit 106 is applied with the sound effect f1, while an audio signal outputted from the output terminal O2 is applied with the sound effect f2. Then, the sound effect added signals are added to each other, and this sum signal is further added with an audio signal outputted from the output terminal O3 and then applied with the sound effect f3. Further, the resultant signal is added with an audio signal outputted from the output terminal O4 and then applied with the sound effect f4 for an output to the DAC 107.

In the connection pattern M3, an audio signal outputted from the output terminal O1 of the sound source circuit 106 is applied with the sound effect f1, while an audio signal outputted from the output terminal O2 is applied with the sound effect f2. Then, the sound effect added signals are added to each other, and this sum signal is further a added with an audio signal outputted from the output terminal O3 and then applied with the sound effect f3. On the other hand, an audio signal outputted from the output terminal O4 is applied with the sound effect f4 and added with the sound effect f3 added signal for an output to the DAC 107.

In the connection pattern M4, an audio signal outputted from the output terminal O1 of the sound source circuit 106 is applied with the sound effect f1, then added with an audio signal outputted from the output terminal O2, and further applied with the sound effect f2. On the other hand, an audio signal outputted from the output terminal O3 is applied with the sound effect f3, then added with an audio signal outputted from the output terminal O4, and further applied with the sound effect f4. Then, the sound effect f2 added signal and the sound effect f4 added signal are added to each other for an output to the DAC 107.

In the connection pattern M5, an audio signal outputted from the output terminal O1 of the sound source circuit 106 is applied with the sound effect f1, while an audio signal outputted from the output terminal O2 is applied with the sound effect f2. Then, the sound effect added signals are added to each other. On the other hand, an audio signal outputted from the output terminal O3 is applied with the sound effect f3, while an audio signal outputted from the output terminal O4 is applied with the sound effect f4. Then, the sound effect f3 and f4 added signals are added to each other. Further, the sound effect f1 and f2 sum signal and the sound effect f3 and f4 sum signal are added to each other for an output to the DAC 107.

FIG. 4 shows signal flows in the main routine to be executed at each DSP. Each DSP is a general-purpose DSP, wherein the sound effect connection patterns M1 to M5 shown in FIG. 3 can be provided only by adjusting coefficient data C11–C52 shown in FIG. 4. The connection pattern in each DSP is whether the sound effect functions (f1 and f2 in DSP 1*a*: f3 and f4 in DSP 1*b*) are connected in serial or parallel.

In case of serial connection, a signal inputted via the input terminal Sin1 and added with the sound effect f1 passes through to C21, C41 and C51 by setting C11 to 7FFFH. Then, by setting C41 and C51 to 0H and C21 to 7FFFH, the sound effect f1 added signal passes through to the input side of f2 and then added by an adder with a signal inputted via the input terminal Sin2 and passing through C22 (=7FFFH). Then, this sum signal is further applied with the sound effect f2. By setting C31 to 7FFFH and C42 or C52 to 7FFFH, the sound effect f2 added signal is outputted from the output terminal Sout1 or Sout2. As appreciated, in this case, C52 or C42 is set to 0H.

In case of parallel connection, by setting C22 to 7FFFH and C21 to 0H, signals inputted via the input terminals Sin1 and Sin2 are applied with the sound effects f1 and f2, respectively. Further, by setting C11, C31, C51 and C52 (C11, C31, C41 and C42) to 7FFFH and C41 and C42 (C51 and C52) to 0H. the sound effect f1/f2 sum signal is outputted from the output terminal Sout2 (Sout1).

On the other hand, in case of change in sound effect rather than change in sound effect connection, by setting C11 to 0H and C12 to 7FFFH and setting C31 to 0H and C32 to 7FFFH, the corresponding sound effect adding routines can be bypassed. In this case, by gradually increasing and decreasing values complimentarily between C11 and C12 and between C31 and C32, the signal applied with the sound effect adding process and the signal not applied with the sound effect adding process can be cross-faded. As appreciated, the signals can also be cross-faded when changing from the bypassed state to a state where the audio signal applied with a new sound effect is outputted.

When performing the cross-fade using C11, C12, C31 and C32, it may be arranged that the master CPU 10 sends values of C11, C12, C31 and C32 successively to the DSP. On the other hand, owing to enhancement of the performance of the DSP, the coefficient values for the cross-fade can be derived through computation of the DSP itself. In this case, the master CPU 10 sends to the DSP, as coefficient data, a value by which each of C11, C12, C31 and C32 is successively increased or decreased. For example, when the master CPU 10 sends coefficient data of C'11=0001H (+1) and C'12=FFFFH (−1), the DSP performs computation of C11←C'11+C11 and C12←C'12+C12 repeatedly until C11 and C12 reach the maximum value (7FFFH) and the minimum value (000H), respectively, and stores the computation results as envelope values in the C-RAM 2*b*. The cross-fade may also be performed between C21 and C22, between C41 and C42 and between C51 and C52. In FIG. 4, t1 to t6 denote temporary registers for the DSP to temporarily store the computation results.

Figure 5:
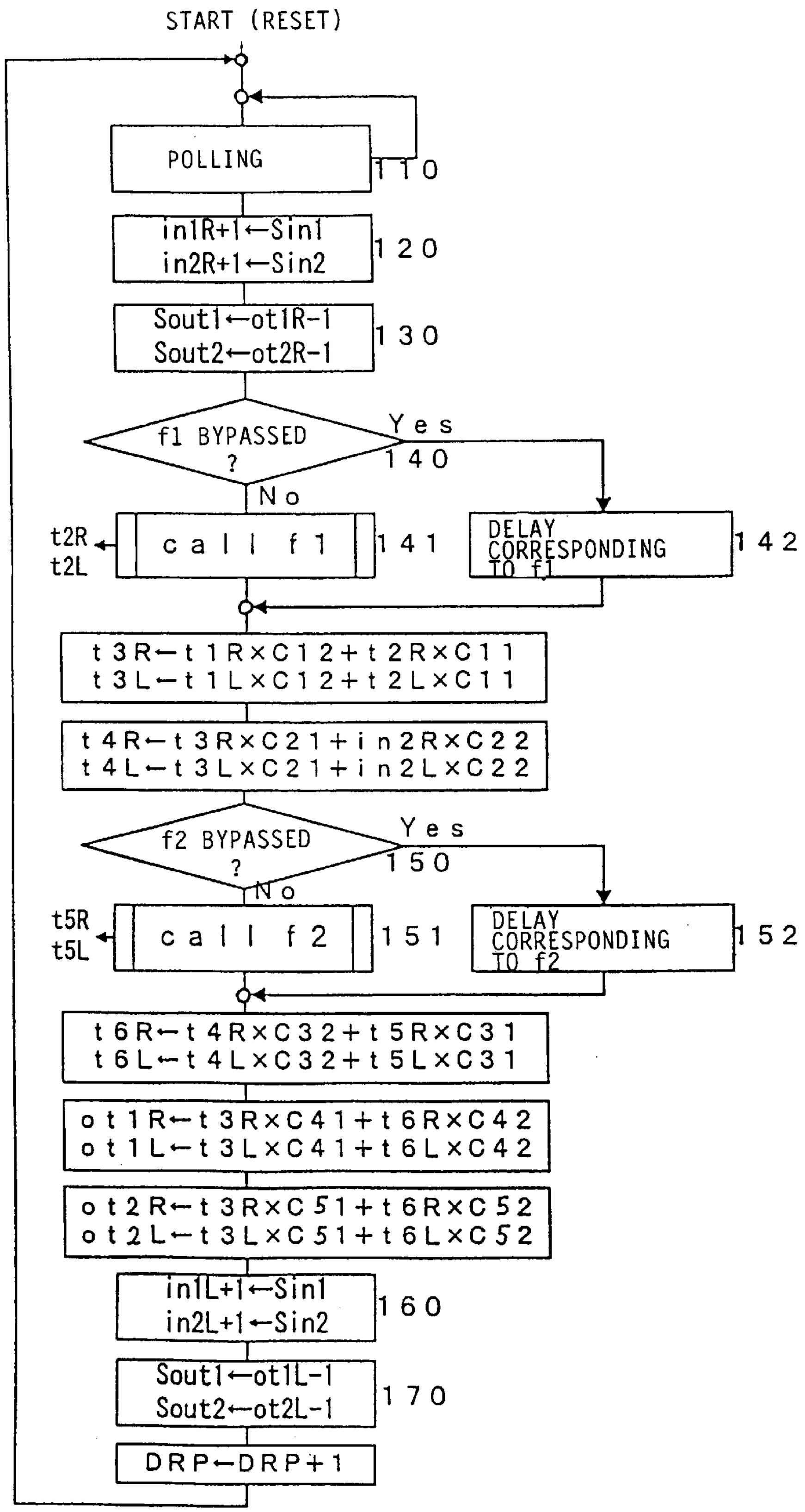
FIG. 5 is a flowchart of the main routine to be executed at one of the DSP's in the sound effect adding device shown in FIG. 1.

FIG. 5 is a flowchart of the main routine to be executed by the DSP 1*a* (DSP 1*b*).

A polling step 110 monitors a leading edge of a WS (word select) signal sent from the sound source circuit 106 so as to detect the start of one period of the audio signal.

Rch (right channel) input step 120 stores the signals inputted from the input terminals Sin1 and Sin2 into registers in1 and in2 as in1R+1 and in2R+1 (see FIG. 4). Then, Rch output step 130 outputs signal data ot1R−1 and ot2R−1 to the output terminals Sout1 and Sout2 from temporary registers ot1 and ot2.

Step 140 determines whether to execute the sound effect adding routine f1 or bypass the routine f1 due to a new sound effect adding program being transferred (for example, a tremolo effect adding program is switched to a distortion effect adding program). This is because, since, during transfer of the sound effect adding program due to change in sound effect, the corresponding clearing operations are performed in the I-RAM 2*a* and the C-RAM 2*b*, if the sound effect adding routine f1 is executed, the routine may malfunction or the large noise may be generated. The determination to bypass the routine f1 may be effected by changing values of given addresses in the C-RAM 2*b* through the master CPU 10 or by directly sending a signal to a general-purpose input port of the DSP from the master CPU 10.

Figure 7:
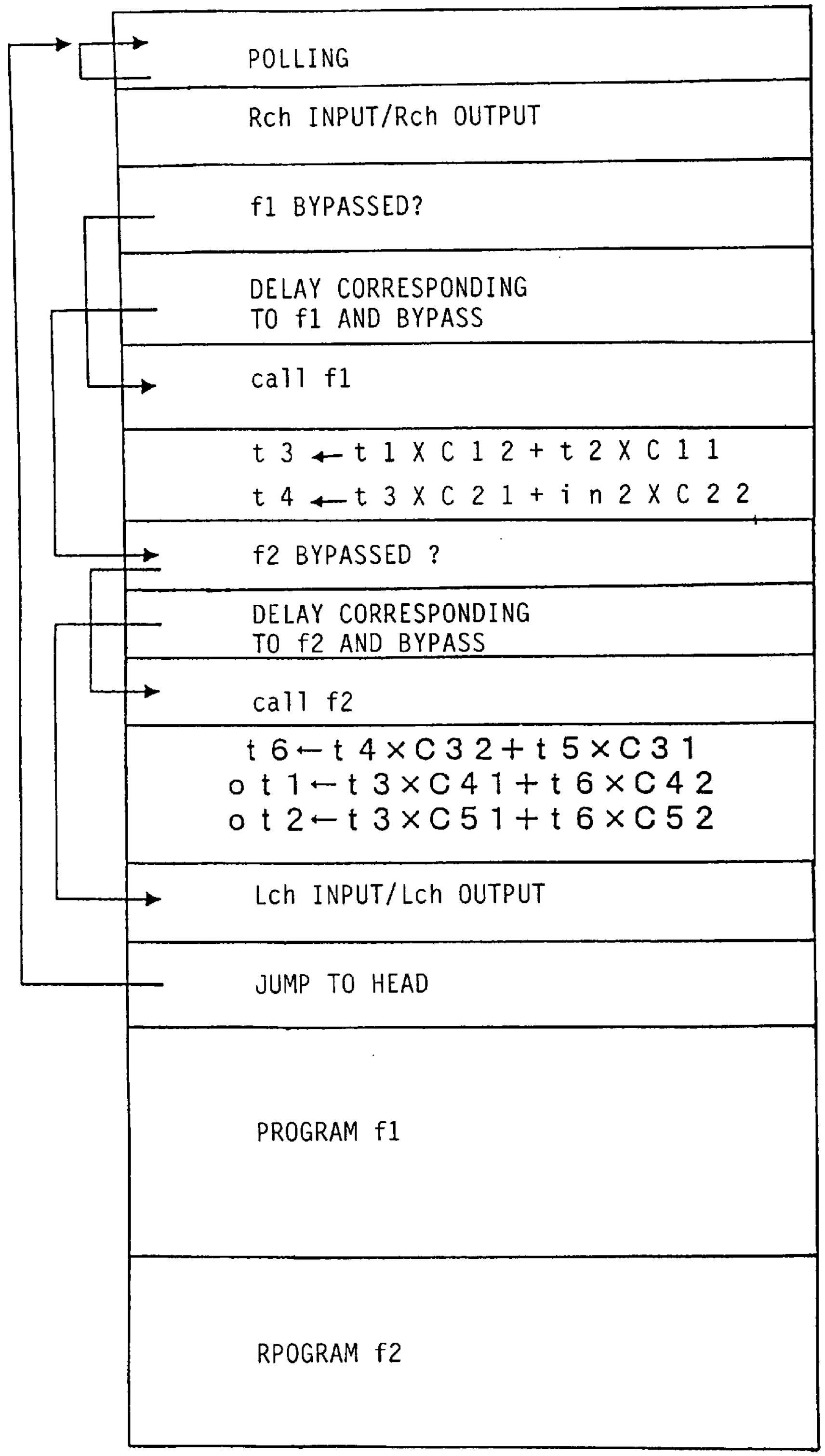
FIG. 7 is a diagram for explaining a mapping state of an instruction RAM of the DSP in the sound effect adding device shown in FIG. 1.

If the routine f1 is determined to be executed, the routine proceeds to step 141 where the routine f1 is called. As shown in FIG. 7 illustrating a mapping state of the I-RAM 2*a*, the sound effect adding 64 routine f1 is stored in the latter part of the I-RAM 2*a*. As shown in FIG. 4, after the execution of the routine f1, Rch signal data t1R stored in the temporary register t1 is multiplied by a value of C12 and Rch signal data t2R stored in the temporary register t2 is multiplied by a value of C11, and then these products are added to each other so as to be stored in the temporary register t3 as Rch signal data t3R for the Rch Input (t3R←t1R×C12+t2R×C11). This also applies to the Lch input (t3L t1L×C12+t2L×C11). The signal data t3R and t3L stored in the temporary register t3 are multiplied by a value of C21 and the signal data in2R and in2L stored in the register in2 are multiplied by a value of C22, and then these products are added to each other so as to be stored in the temporary register t4 as signal data t4R and t4L (t4R←t3R×C21+in2R×C22, t4L←t3L×C21+in2L×C22).

Figure 6:
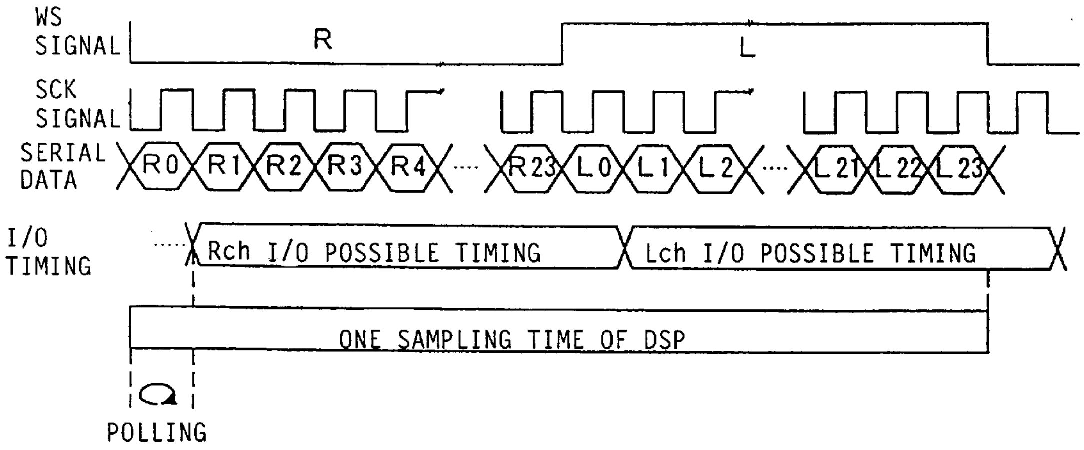
FIG. 6 is a time chart showing input/output timings of the DSP in the sound effect adding device shown in FIG. 1.

On the other hand, if the routine f1 is determined to be bypassed, the routine proceeds to step 142 where a wait process is performed, before bypassing the routine f1, to delay an output timing of the signal corresponding to the number of steps of the routine f1. In this preferred embodiment, a loop is performed corresponding to the number of necessary steps using a loop instruction incorporated in the DSP. Specifically, the number of steps of the routine f1 written in the C-RAM 2*b* is loaded so as to delay the output timing of the signal corresponding to the number of steps. This loop is required due to the fact that the DSP used in this preferred embodiment is a general-purpose DSP and thus redundant functions are omitted so that, as seen from a time chart of FIG. 6 showing DSP input/output timings, the input/output of the Rch or Lch signal should be performed within a given time (corresponding to a serial data R0 or L0 processing time) from the leading edge (or the trailing edge) of the WS signal.

Since subsequent steps 150, 151 and 152 are substantially the same as the foregoing steps 140, 141 and 142, respectively, no further detailed explanation will be given hereinbelow.

In this preferred embodiment, the output timing of the signal is delayed so that a time from step 120 to step 160 becomes no less than a half of one sampling time of the DSP.

After the execution of the routine f2, signal data t4R and t4L stored in the temporary register t4 are multiplied by a value of C32 and signal data t5R and t5L stored in the temporary register t5 are multiplied by a value of C31, and then these products are added to each other so as to be stored in the temporary register t6 as signal data t6R and t6L (t6R←t4R×C32+t5R×C31, t6L←t4L×C32+t5L×C31).

The signal data t3R and t3L stored in the temporary register t3 are multiplied by a value of C41 and the signal data t6R and t6L stored in the temporary register t6 are multiplied by a value of C42, and then these products are added to each other so as to be stored in the temporary register ot1 as signal data ot1R and ot1L for outputs to the output terminal Sout1 (ot1R←t3R×C41+t6R×C42, ot1L←t3L×C41+t6L×C42). The signal data t3R and t3L stored in the temporary register t3 are multiplied by a value of C51 and the signal data t6R and t6L stored in the temporary register t6 are multiplied by a value of C52, and then these products are added to each other so as to be stored in the temporary register ot2 as signal data ot2R and ot2L for outputs to the output terminal Sout2 (ot2R←t3R×C51+t6R×C52, ot2L←t3L×C51+t6L×C52).

Then, Lch (left channel) input step 160 stores the signals inputted from the input terminals Sin1 and Sin2 into registers in1 and in2 as in1L+1 and in2L+1 (see FIG. 4). Then, Lch output step 170 outputs signal data ot1L−1 and ot2L−1 to the output terminals Sout1 and Sout2 from the temporary registers ot1 and ot2.

Finally, a value of DRP (data RAM pointer) is incremented by +1, and the routine returns to the start. This increment renders it possible to automatically access a +1 incremented address even when the same data RAM address is designated in the next execution cycle of the main routine based on the next sampling. Accordingly, the input data stored as in1R/L+1 and in2R/L+1 in the last execution cycle are read out as in1R/L and in2R/L in the current execution cycle. Further, the output data stored as ot1R/L and ot2R/L in the current execution cycle will be read out as ot1R/L−1 and ot2R/L−1 during the next sampling time.

In the DSP main routine shown in FIG. 5, all the processes are executed during one sampling time (44.1 KHz), and then the polling is again performed waiting for rising of the WS signal. This series of processes are executed In pipelining using three successive sampling times as shown in Table 2. Specifically, during a time T−1, processes of steps 120 and 160 are performed. During the next time T. processes of steps 140, 141 and 142, t3R←t1R×C12+t2R×C11, t3L←t1L×C12+t2L×C11, t4R←t3R×C21+in2R×C22, t4L←t3L×C21+in2L×C22, steps 150, 151 and 152, t6R←t4R×C32+t5R×C31, t6L←t4L×C32+t5L×C31, ot1R←t3R×C41+t6R×C42, ot1L←t3L×C41+t6L×C42, ot2R←t3R×C51+t6R×C52 and ot2L←t3L×C51+t6L×C52 are performed. Further, during a time T+1, processes of steps 130 and 170 are performed.

Assuming that the system clock of the DSP is 20 MHz, the number of steps executable during one sampling time is given by the following inequality:

$$[1/(44.1\times 10^3)] > [X/(20\times 10^6)]$$
$$X < [(20\times 10^6)/(44.1\times 10^3)]$$
$$< 453.514$$

TABLE 2

| T − 1 → | T → | T + 1 |
|---|---|---|
| in1R + 1 ← Sin1<br>in2R + 1 ← Sin2 | | |
| | | Sout1 ← ot1R − 1<br>Sout2 ← ot2R − 1 |
| | f1 bypassed?<br>call f1<br>delay corresponding to f1<br>t3 ← t1 × C12 + t2 × C11 | |

TABLE 2-continued

| T − 1 → | T → | T + 1 |
|---|---|---|
| | t4 ← t3 × C21 + in2 × C22<br>f2 bypassed?<br>call f2<br>delay corresponding to f2<br>t6 ← t4 × C32 + t5 × C31<br>ot1 ← t3 × C41 + t6 × C42<br>ot2 ← t3 × C51 + t6 × C52 | |
| in1L + 1 ← Sin1<br>in2L + 1 ← Sin2 | | |
| | | Sout1 ← ot1L − 1<br>Sout2 ← ot2L − 1 |

Now, the mapping of the I-RAM 2*a* of the DSP will be described with reference to FIG. 7., As shown in FIG. 7, the I-RAM 2*a* stores the main routine shown in FIG. 5 at its first part and, subsequent to the main routine, the sound effect adding routines f1 and f2 at its latter part which become operable when accessed by the main routine. As described before, a new sound effect adding program is transferred from the master CPU 10 as f1 or f2 when such a change in sound effect is selected by the user through the panel. In this case, however, the main routine is not subjected to alteration. The main routine includes a program for controlling the input and output of the audio signals [Rch input/output (in1R+1←Sin1, in2R+1←Sin2, Sout1←ot1R−1, Sout2←ot2R−1), Lch input/output (in1L+1←Sin1, in2L+1←Sin2, Sout1←ot1L−1, Sout2←ot2L−1). Further, the main routine has a function to assign the input signals (Rch and Lch input signals) to the sound effect adding routines f1 and f2 (step 141 and 151) and collect the sound effect added signals outputted from the routines f1 and f2 (t3R←t1R×C12+t2R×C11, t3L←t1L×C12+t2L×C11, t4R←t3R×C21+in2R×C22, t4L←t3L×C21+in2L×C22, t6R←t4R×C32+t5R×C31, t6L←t4L×C32+t5L×C31, ot1R←t3R×C41+t6R×C42, ot1L←t3L×C41+t6L×C42, ot2R←t3R×C51+t6R×C52 and ot2L←t3L×C51+t6L×C52) for outputting as the output signals (Rch and Lch output signals). The main routine further includes a command to apply a delay corresponding to the routine f1 or f2 when the routine f1 or f2 is bypassed.

The electronic musical instrument according to this preferred embodiment is used in the following manner:

By turning on the switch, the master CPU 10 performs initialization of the panel, the RAM 104 and the DSP's 1*a* and 1*b*. Then, the master CPU 10 reads out the necessary data from the FD input/output block 103 into the RAM 104. In response to the panel operation by the user, the master CPU 10 transfers the main routine and the sound effect adding routines from the RAM 104 and/or the ROM 105 to the I-RAM's 2*a* of the DSP's 1*a* and 1*b*. As appreciated, in this case, each of the sound effect adding routines to be transferred is determined based on a kind of sound effect selected by the user's panel operation. Simultaneously, the coefficient data corresponding to the selected sound effect kind are also transferred to each of the C-RAM's 2*b* of the DSP's. Thus, through the panel operation, one of the sound effect connection patterns M1 to M5 has been determined.

Then, in response to the user's operation, the key switch on-off information and the corresponding key velocity data from the key switch block 101 and other performance data from the MIDI input/output block 102, the RAM 104 and/or the ROM 105 are sent to the master CPU 10. Based on these performance data, the master CPU 10 sends the corresponding tone parameters and the key on/off assigned result to the sound source circuit 106 so that the tone generation data are outputted from the output terminals O1 to O4 of the sound source circuit 106.

The tone generation data are sent to each of the D-RAM's 2*c* of the DSP's via the SIO1 and SIO2 thereof and applied with the sound effect adding processes based on either one of the sound effect connection patterns M1 to M5. The sound effect adding routines to be used for the sound effect adding processes are mapped in the latter part of the I-RAM 2*a* and executed when called by the main routine. As described before, the patterns M1 to M5 are determined by the coefficient data, and thus the sound effect connection pattern can be changed only by changing the coefficient data. As appreciated, however, the kind of the sound effect adding routine can not be changed by changing the coefficient data. For this, a new sound effect adding program should be transferred from the master CPU 10. The audio signal applied with the selected sound effects is outputted from the DAC 107 into the speaker where the corresponding tone is generated via the amplifier.

When a new sound effect is selected through the panel operation during the performance, the master CPU 10 transfers a corresponding sound effect adding program and corresponding coefficient data from the RAM 104 or the ROM 105 to the corresponding DSP. During the transfer of the program, the corresponding sound effect adding routine fn is controlled to be bypassed. In this case, by gradually increasing and decreasing values complimentarily between C11 and C12 or between C31 and C32, the signal applied with the sound effect adding process and the signal not applied with the sound effect adding process can be cross-faded. The signals can also be cross-faded when changing from the bypassed state to a state where the audio signal applied with the new sound effect is outputted.

For example, the master CPU 10 performs the cross-fade by changing C11 and C31 of the DSP (DSP's) as 7FFFH→0H and C12 and C32 as 0H→7FFFH. Through this control, both the routines f1 (f3) and f2 (f4) are bypassed. The master CPU 10 commands the DSP (DSP's) to bypass the routines f1 (f3) and f2 (f4). As described before, this command may be effected by changing the corresponding coefficient data in the C-RAM (C-RAM's) 2*b* through the master CPU 10 or by sending a signal to the general-purpose input port of the DSP (DSP's) from the master CPU 10. While receiving this signal, the DSP (DSP's) does not access the areas of the programs f1 (f3) and f2 (f4) of the I-RAM (I-RAM's) 2*a*. The master CPU 10 transfers only such sound effect adding programs necessary for rewriting the DSP (DSP's). Even during the transfer of the programs, the DSP (DSP's) continues to output the audio signal per sampling without adding the sound effect. Thereafter, the master CPU 10 commands the DSP (DSP's) to stop bypassing the routines f1 (f3) and f2 (f4). Then, the DSP (DSP's) returns to the normal processing so as to access the sound effect adding routines f1 (f3) and f2 (f4). However, since C11 and C31 are still set to 0H and C12 and C32 are still set to 7FFFH, the audio signal is the same as that while the routines are bypassed. Then, the master CPU 10 transfers new coefficient data to the DSP (DSP's). Thereafter, a given term is necessary for the DSP (DSP's) to enable a normal computation based on the new coefficient data. In general, taking into account a time for rewriting the data of the external RAM, lmsec to 50 msec is necessary. This term Is proportional to the storage capacity of the external RAM. When the new sound effect adding routines can be normally processed based on the new coefficient data, the master CPU 10 performs the cross-fade by changing C11 and C31 of the DSP (DSP's) as 0H→7FFFH and C12 and C32 as 7FFFH→0H. Through this control, the addition of the new sound effects is made possible. As appreciated, for achieving the cross-fade, no particular discrete parts, such as a cross-fade circuit or an adder, are required.

In the foregoing example, the cross-fade is performed both between C11 and C12 and between C31 and C32. However, if, for example, only the sound effect adding routine f1 is changed to another, it is not necessary to perform the cross-fade between C31 and C32. Although the processing in the master CPU 10 is rather complicated when transferring the new sound effect adding program, it is very simple when transferring only the coefficient data.

In the foregoing preferred embodiment, the sound effect adding routines are stored in a given area of the I-RAM of each DSP regardless of the sound effect to be added. Further, each of the sound effect adding routines has the number of computation steps such that all the sound effect adding routines can be stored in the given area of the I-RAM. This is because the given area for the sound effect adding routines is so limited and further the number of computation steps usable in each routine is also so limited. By setting addresses of each routine so as to correspond to the maximum number of computation steps, a new sound effect adding routine can be stored in the given area of the I-RAM in a serial manner without causing address jumping.

While the present invention has been described in terms of the preferred embodiment, the invention is not to be limited thereto, but can be embodied in various ways without departing from the principle of the invention as defined in the appended claims.

What is claimed is:

1. A sound effect adding device controlled by a main arithmetic circuit and capable of simultaneously selecting and processing a plurality of sound effects using a DSP, said sound effect adding device comprising an instruction storage section in said DSP for storing a main routine including a program for controlling an input and an output of an audio signal, and a plurality of selected sound effect adding routines transferred from said main arithmetic circuit from among selectable sound effect adding routines when necessary and operable when accessed by said main routine, wherein said main routine has a function to assign the input audio signal to the selected sound effect adding routines and collect sound effect added signals outputted from said selected sound effect adding routines so as to provide an output signal, and wherein, by changing coefficient data transferred from said main arithmetic circuit and stored in said DSP, said main routine performs change in connection between said input and output signals so as to change a combination of said sound effects without altering said main routine.

2. The sound effect adding device according to claim 1, wherein, when changing the coefficient data to perform said connection change, envelope values derived in said DSP are used as said coefficient data, and wherein said coefficient data are gradually changed to target values so as to perform a cross-fade.

3. The sound effect adding device according to claim 1, wherein said selected sound effect adding routines are stored in a given area of said instruction storage section regardless of sound effects to be added, and wherein all of said selectable sound effect adding routines can be stored in said given area.

4. A sound effect adding device controlled by a main arithmetic circuit and capable of selecting and processing a plurality of sound effects using a DSP, said sound effect adding device comprising an instruction storage section in said DSP for storing a main routine including a program for controlling an input and an output of an audio signal, and a selected sound effect adding routine transferred from said main arithmetic circuit from among selectable sound effect adding routines when necessary and operable when accessed by said main routine, wherein, when changing said selected sound effect adding routine, said selected sound effect adding routine is bypassed, while an output timing of the audio signal is delayed by a time corresponding to an execution time required for executing said selected sound effect adding routine.

5. The sound effect adding device according to claim 4, wherein said main routine accesses said selected sound effect adding routine between a first input/output processing of the audio signal and a second input/output processing of the audio signal, and wherein said output timing of the audio signal is delayed so that a time between said first and second input/output processings becomes no less than a half of one sampling time of the DSP.

* * * * *